United States Patent
Ting

(10) Patent No.: US 9,564,355 B2
(45) Date of Patent: Feb. 7, 2017

(54) INTERCONNECT STRUCTURE FOR SEMICONDUCTOR DEVICES

(71) Applicant: Taiwan Semiconductor Manufacturing Company, Ltd., Hsin-Chu (TW)

(72) Inventor: Chih-Yuan Ting, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 90 days.

(21) Appl. No.: 14/100,753

(22) Filed: Dec. 9, 2013

(65) Prior Publication Data
US 2015/0162262 A1    Jun. 11, 2015

(51) Int. Cl.
| | |
|---|---|
| H01L 23/48 | (2006.01) |
| H01L 21/764 | (2006.01) |
| H01L 29/06 | (2006.01) |
| H01L 21/768 | (2006.01) |
| H01L 23/528 | (2006.01) |

(52) U.S. Cl.
CPC ..... *H01L 21/7682* (2013.01); *H01L 21/76811* (2013.01); *H01L 23/5283* (2013.01); *H01L 2924/0002* (2013.01)

(58) Field of Classification Search
USPC ........................................ 257/522; 438/668
See application file for complete search history.

(56) References Cited

U.S. PATENT DOCUMENTS

| | | | | |
|---|---|---|---|---|
| 7,749,891 B2* | 7/2010 | Ueda | ............... | H01L 21/76801 438/421 |
| 7,973,409 B2* | 7/2011 | Yang | ............... | H01L 21/7682 257/751 |
| 2006/0057835 A1* | 3/2006 | Anderson | ......... | H01L 21/76802 438/619 |
| 2008/0182405 A1* | 7/2008 | Liu | ............... | H01L 21/76807 438/623 |

FOREIGN PATENT DOCUMENTS

KR    100818108 B1    3/2008

* cited by examiner

*Primary Examiner* — Robert Carpenter
(74) *Attorney, Agent, or Firm* — Slater Matsil, LLP

(57) ABSTRACT

An interconnect and a method of forming an interconnect for a semiconductor device is provided. Conductive lines having different widths are formed. Wider conductive lines are used where the design includes an overlying via, and narrower lines are used in which an overlying via is not included. An overlying dielectric layer is formed and trenches and vias are formed extending through the overlying dielectric layer to the wider conductive lines. Voids or air gaps may be formed adjacent select conductive lines, such as the narrower lines.

20 Claims, 8 Drawing Sheets

INTERCONNECT STRUCTURE FOR SEMICONDUCTOR DEVICES

BACKGROUND

In integrated circuit art, a commonly used method for forming interconnect structures, which include metal lines and vias, is known as "damascene." Generally, this method involves forming an opening in a dielectric layer, which separates the vertically spaced metallization layers. The opening is typically formed using lithographic and etching techniques. After the formation, the opening is filled with copper or copper alloys. Excess copper on the surface of the dielectric layer is then removed by a chemical mechanical polish (CMP). The remaining copper or copper alloy forms vias and/or metal lines.

Copper is commonly used in damascene structures because of its low resistivity. Typically, an interconnect structure is formed of a plurality of metallization layers, each including a plurality of copper lines. Copper lines in different metallization layers are interconnected by vias. While copper is generally used due to its electrical characteristics, other materials may be used.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Methods for forming metal features in metallization layers of integrated circuits are provided. The intermediate stages of manufacturing embodiments of the present invention are illustrated. Throughout various views and illustrative embodiments, like reference numbers are used to designate like elements.

As will be discussed in greater detail below, conductive lines are formed having different widths. Wider conductive lines are utilized where an overlying via is desired. The wider conductive lines reduces the electron migration and helps reduce or prevent void formation. Narrower conductive lines are utilized where overlying vias are omitted. Furthermore, in other embodiments, voids may be created adjacent the narrower lines to provide additional insulation between conductive lines.

Figure 1:
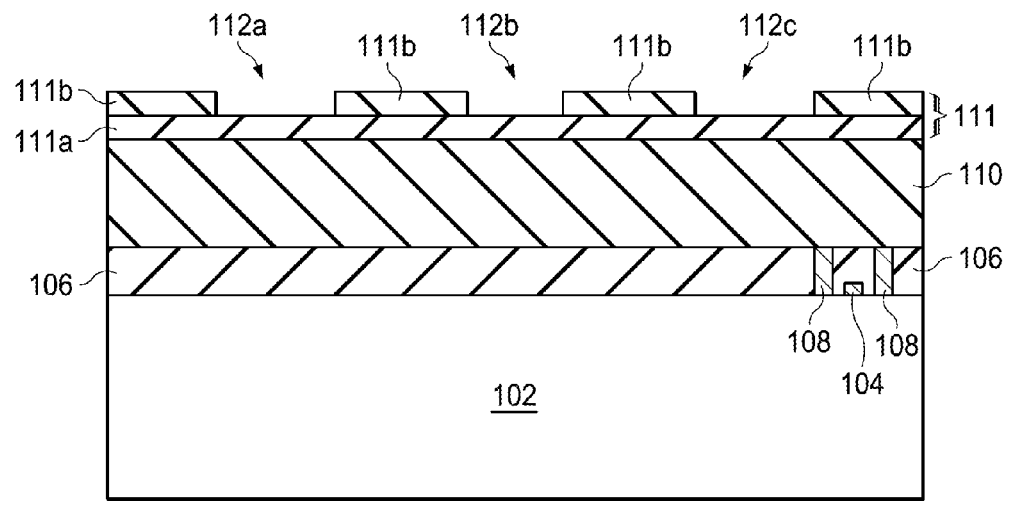
FIGS. 1-6 illustrate various intermediate stages in a manufacture of a semiconductor device in accordance with an embodiment.

FIGS. 1-6 illustrate various intermediate stages of a method of forming a semiconductor device in accordance with an embodiment. Referring first to FIG. 1, there is shown a substrate 102 having electrical circuitry (illustrated collectively by electrical circuitry 104) formed thereon. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 104 formed on the substrate 102 may be any type of circuitry suitable for a particular application. For example, the electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 is a first dielectric layer 106, such as an inter-layer dielectric (ILD) layer. The first dielectric layer 106 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the first dielectric layer 106 may comprise a plurality of dielectric layers.

Contacts 108 are formed through the first dielectric layer 106 to provide an electrical contact to the electrical circuitry 104. The contacts 108 may be formed, for example, by using photolithography techniques to deposit and pattern a photoresist material on the first dielectric layer 106 to expose portions of the first dielectric layer 106 that are to become the contacts 108. An etch process, such as an anisotropic dry etch process, may be used to create openings in the first dielectric layer 106. The openings may be lined with a diffusion barrier layer and/or an adhesion layer (not shown), and filled with a conductive material. The diffusion barrier layer comprises one or more layers of TaN, Ta, TiN, Ti, CoW, or the like, and the conductive material comprises copper, tungsten, aluminum, silver, and combinations thereof, or the like, thereby forming the contacts 108 as illustrated in FIG. 1.

A second dielectric layer 110, such as an inter-metal dielectric (IMD) layer, is formed over the first dielectric layer 106. Generally, the ILD and IMD layers, such as the first dielectric layer 106 and the second dielectric layer 110, and the associated metallization layers are used to interconnect the electrical circuitry to each other and to provide an external electrical connection. The second dielectric layer 110 may be formed of a low-K dielectric material, such as FSG formed by PECVD techniques or high-density plasma chemical vapor deposition (HDPCVD) or the like, and may include intermediate etch stop layers. The ILD layer and/or IMD layers may be formed of a low-K dielectric material (dielectric constant k less than silicon dioxide), a ultra low-k dielectric (a dielectric constant less than about 2.9), or even an extreme low-k (ELK) dielectric (a dielectric constant less than about 2.5), or the like.

It should also be noted that one or more etch stop layers (not shown) may be positioned between adjacent ones of the dielectric layers, e.g., the first dielectric layer 106 and the second dielectric layer 110. Generally, the etch stop layers provide a mechanism to stop an etching process when forming vias and/or contacts. The etch stop layers are preferably formed of a dielectric material having a different etch selectivity from adjacent layers, e.g., the underlying substrate 102, the overlying first dielectric layer 106, and the overlying second dielectric layer 110. In an embodiment, etch stop layers may be formed of SiN, SiCN, SiCO, CN, combinations thereof, or the like, deposited by CVD or PECVD techniques.

Also shown in FIG. 1 is a first mask layer 111 formed over the second dielectric layer 110. The first mask layer 111 is a protective layer to prevent the underlying structures from being removed during a subsequent etching process, and may comprise one or more layers. For example, FIG. 1 illustrates an embodiment in which the first mask layer 111 includes an oxide layer 111a and a nitride layer 111b. The oxide layer may be, for example, a silicon dioxide layer formed by thermal oxidation or by chemical vapor deposition (CVD) techniques using tetra-ethyl-ortho-silicate (TEOS) and oxygen as precursor, and the nitride layer may be, for example, a silicon nitride ($Si_3N_4$) layer formed on top of the oxide layer. The $Si_3N_4$ layer may be formed using CVD techniques using silane and ammonia as precursor gases. Other mask materials can be used to form the first mask layer 111.

FIG. 1 illustrates the nitride layer 111b after patterning to form first openings 112a-c in accordance with an embodiment. As illustrated in FIG. 1, the first openings 112a and 112c have a width greater than a width of the first opening 112b. As will be discussed in greater detail below, the first openings 112a-c define shapes of conductive lines to be formed in the second dielectric layer 110. The wider conductive lines are used in locations in which a subsequently formed via extending through a subsequently formed overlying dielectric layer is to make contact. Additionally, the lines not having vias contacting (such as that defined by first opening 112b, may be made narrower.

Due to the high current density that may be present at the junction of the via and the underlying line, electron migration may cause voids to occur in the line and/or junction region. The electron migration may be avoided or reduced by enlarging the underlying lines to which the vias land. The other lines such as that defined by the first opening 112b may be shrunk in size, thereby maintaining a minimum distance between the conductive lines as required for a particular design to limit or prevent leakage current or dielectric breakdown.

The first openings 112a-c may be formed by, for example, using photolithography techniques. Generally, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing steps, such as etching, performed to form the first openings 112.

Figure 2:
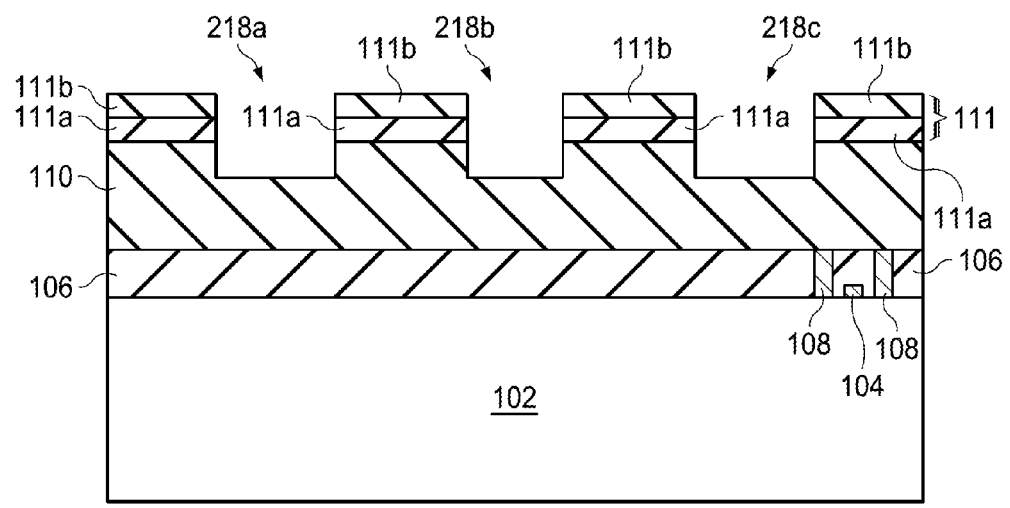

FIG. 2 illustrates the substrate 102 after second openings 218a-c have been formed in the second dielectric layer 110 in accordance with an embodiment. In an embodiment in which the second dielectric layer 110 is formed of a material such as SiC, the second dielectric layer 110 may be patterned with an anisotropic dry etch process using an etchant such as $C_4F_8$ or $C_5F_8$. In an embodiment, the etch process to form the first opening is a timed etch process in which the time the etch process is performed is selected such that the desired depth is achieved.

Figure 3:
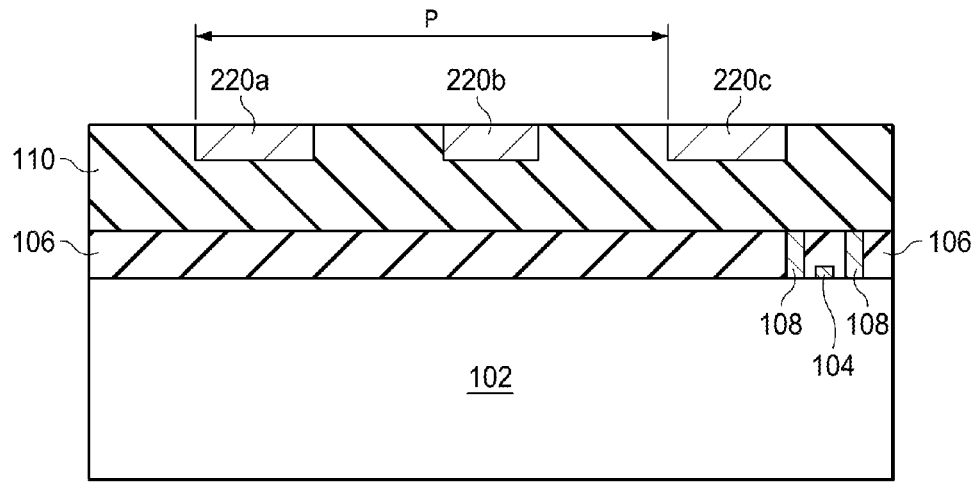

FIG. 3 illustrates filling the second openings 218a-c (see FIG. 2) with a conductive material to form conductive lines 220a-c in accordance with an embodiment. The conductive material may be deposited by CVD, electro-plating, electroless-plating, ALD, PVD, and may be formed of copper, although other suitable materials such as aluminum, tungsten, tungsten nitride, rhuthenium, silver, gold, rhodium, molybdenum, nickel, cobalt, cadmium, zinc, alloys of these, combinations thereof, and the like, may alternatively be utilized. The conductive material may be deposited into the second openings 218a-c (see FIG. 2) and the deposition may be continued until the conductive material fills the second openings 218a-c and extends above the first mask layer 111 (if present).

Optionally, one or more barrier/adhesion layers (not shown) may be formed along the sidewalls of the second openings 218a-c prior to filling with the conductive material. In embodiments, such as those using a copper conductive material, a barrier layer may be desirable to limit diffusion of the copper into the surrounding dielectric materials. In an embodiment, the barrier layer may be formed of one or more layers of titanium nitride, titanium, tantalum, tantalum nitride, tungsten nitride, ruthenium, rhodium, platinum, other noble metals, other refractory metals, their nitrides, combinations of these, or the like. The barrier layer may be formed through chemical vapor deposition, although other techniques such as PVD or ALD could alternatively be used. Excess portions of the conductive material (and any optional barrier/adhesive layers) formed over the first mask layer 111 is removed using a planarization process, such as a chemical mechanical polishing process (CMP).

In an embodiment, the wider conductive lines 220a and 220c are about 1.03 to about 3 times the width of the narrower conductive line 220b. For example, the conductive lines 220a and 220c may have a width of 24.7 nm while the conductive line 220b has a width of 23.2 nm, wherein the conductive lines 220a and 220c are 1.06 times the width of conductive line 220b. In another example, the conductive lines 220a and 220c may have a width of 36 nm while the conductive line 220b has a width of 12, wherein the conductive lines 220a and 220c are 3 times the width of conductive line 220b. The widths may be adjusted for a specific application such that the wider conductive lines allow for an increased area at the junction of an overlying via and the conductive line, thereby reducing the electron current density and electron migration, which in turn reduces or prevents voids from forming.

In an embodiment, the pitch P between conductive lines 220a and 220c is about 80 nm and about 95 nm. Immersion lithography may be used to achieve a pitch P of about 80 nm in a 22 nm technology node and about 95 nm in a 28 or 32 nm technology node. Using EUV lithography, a pitch P of less than 80 nm may be obtained. A pitch of 80 nm is the current smallest pitch obtained by immersion lithography; however, through multiple patterning approaches (double-patterning/double-etching (2P2E) or self-aligned double patterning), smaller pitches may be obtained. By applying 3P3E or self-aligned quarter patterning, the wide metal to wide metal pitch can be further reduced as discussed herein.

Figure 4:
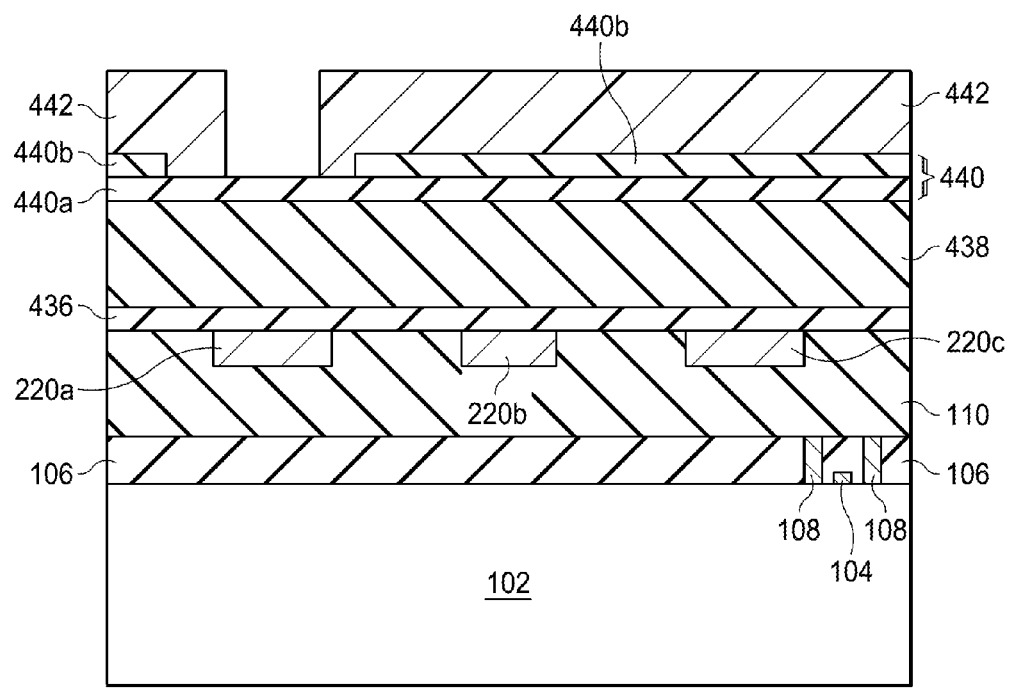

FIG. 4 illustrates an etch stop layer (ESL) 436 and a third dielectric layer 438 formed over the second dielectric layer 110 in accordance with an embodiment. Generally, the etch stop layer provides a mechanism to stop an etching process when forming vias and/or contacts. The etch stop layers are formed of a dielectric material having a different etch selectivity from adjacent layers, e.g., the underlying second dielectric layer 110. In an embodiment, etch stop layers may be formed of SiN, SiCN, SiCO, CN, combinations thereof, or the like, deposited by CVD or PECVD techniques.

Over the ESL 436 is the third dielectric layer 438 in accordance with an embodiment. As discussed in greater detail below, the third dielectric layer 438 is the layer that is to be subsequently patterned to, for example, form conductive lines and/or vias. For example, the third dielectric layer 438 may be patterned to form vias extending to one or more of the conductive lines 220a-c formed in the second dielectric layer 110. The third dielectric layer 438 may be formed of similar materials using similar processes as those used to form the first dielectric layer 106 and/or the second dielectric layer 110; however, different materials and processes may be used.

Figure 5:
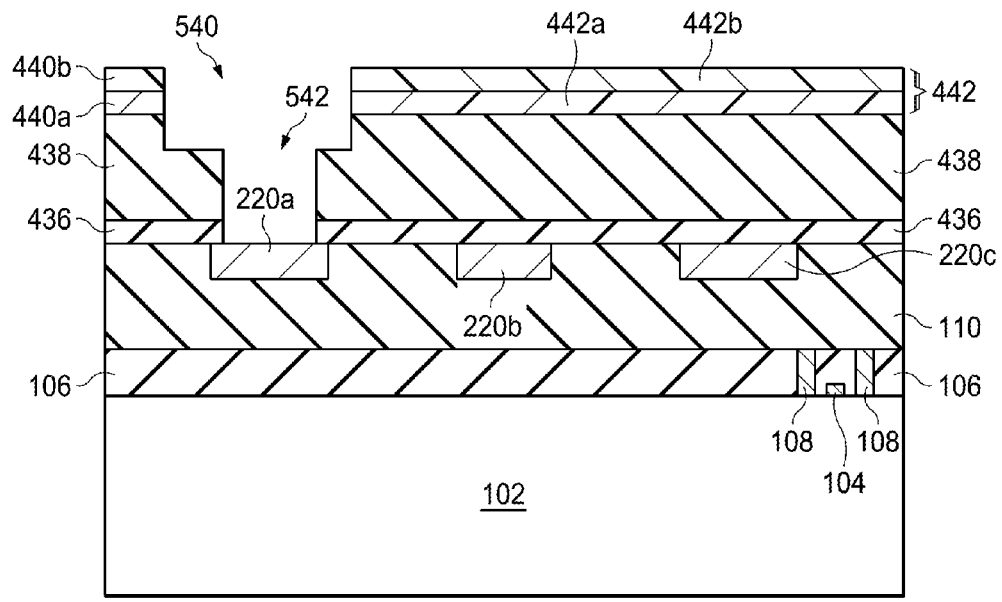

Also shown in FIG. 4 is a second mask 440 and photoresist mask 442. In an embodiment, the second mask 440 may include a multi-layer structure, such as an oxide layer 440a and a nitride layer 440b similar to the first mask 111 discussed above with reference to FIG. 1. In the embodiment illustrated in FIG. 4, the nitride layer 440b is patterned to form a trench, and an overlying photoresist is patterned for a via. During a subsequent etch process, the oxide 440a is etched corresponding to a via shape. The etch process continues to etch the third dielectric layer, while consuming the photoresist. When the photoresist is consumed, the oxide layer 440a within the trench opening is exposed. The etch process removes the exposed portions of the oxide layer 440a and etches the underlying portions of the third dielectric layer 438. The resulting pattern, as illustrated in FIG. 5, comprises a trench opening 540 with a via opening 542 extending from the bottom of the trench to an underlying conductive line, such as the conductive line 220a in this example.

Figure 6:
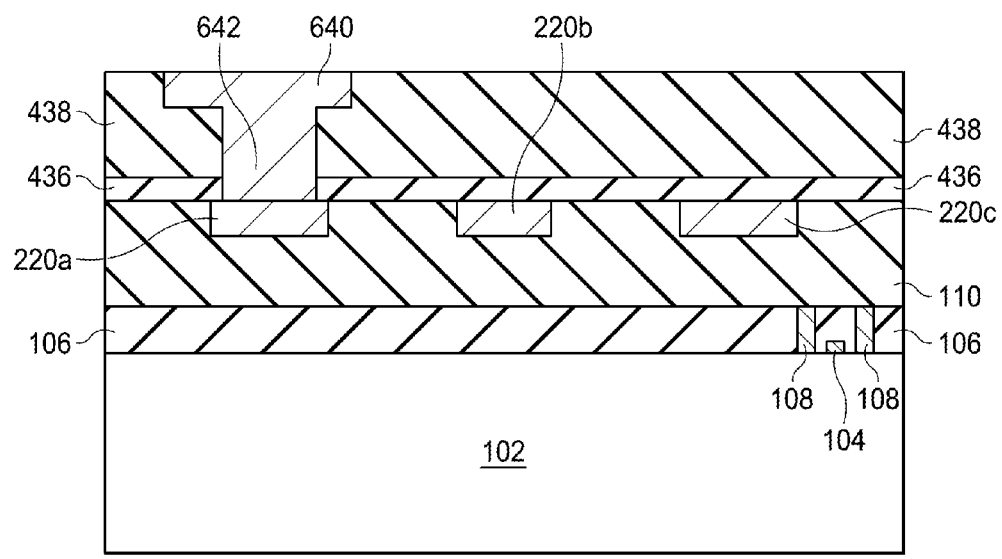

FIG. 6 illustrates filling the trench opening 540 and the via opening 542 (see FIG. 5) with a conductive material to form a conductive line 640 and via 642 in accordance with an embodiment. The conductive material may be formed of similar materials using similar processes as those used to form the conductive lines 220a-c as discussed above with reference to FIG. 3. Optionally, one or more barrier/adhesion layers (not shown) may be formed along the sidewalls of the trench opening 540 and the via opening 542 prior to forming the conductive material. Excess conductive material and the second mask layer 440 may be removed using a planarization process, such as a CMP.

Figure 7:
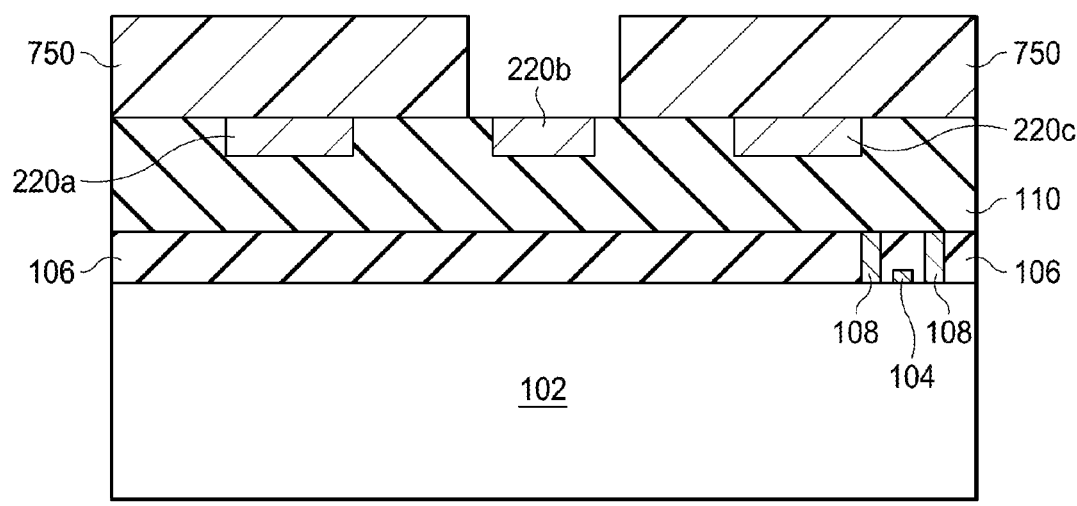
FIGS. 7-10 illustrate various intermediate stages in a manufacture of another semiconductor device in accordance with an embodiment.

FIGS. 7-10 illustrate another embodiment in which an air gap is provided adjacent one or more of the conductive lines. The process illustrated in FIGS. 7-10 assumes a process similar that discussed above with reference to FIGS. 1-3 has been previously performed. As such, FIG. 7 illustrates a patterned mask formed over a structure similar to that illustrated in FIG. 3.

Referring now to FIG. 7, there is shown a mask 750 formed over the second dielectric layer 110 such that the narrower conductive line 220b is exposed. As discussed in greater detail below, the second dielectric layer 110 adjacent to the narrower conductive line 220b is removed to allow a lower-k element, such as an air void, to be placed adjacent to the narrower conductive line 220b. The placement of the air void adjacent to the narrower conductive line reduces the interference between the various conductive lines, such as the interference with conductive lines 220a and 220c in this example.

The mask 750 may be a photoresist material that had been deposited, exposed, and developed to expose the narrower conductive line 220b and the material of the second dielectric layer 110 adjacent to the narrower conductive line 220b. In an embodiment, the mask 750 may include one or more additional masks, such as an oxide mask and/or a nitride mask such as that described above to provide additional protection during the etch process.

Figure 8:
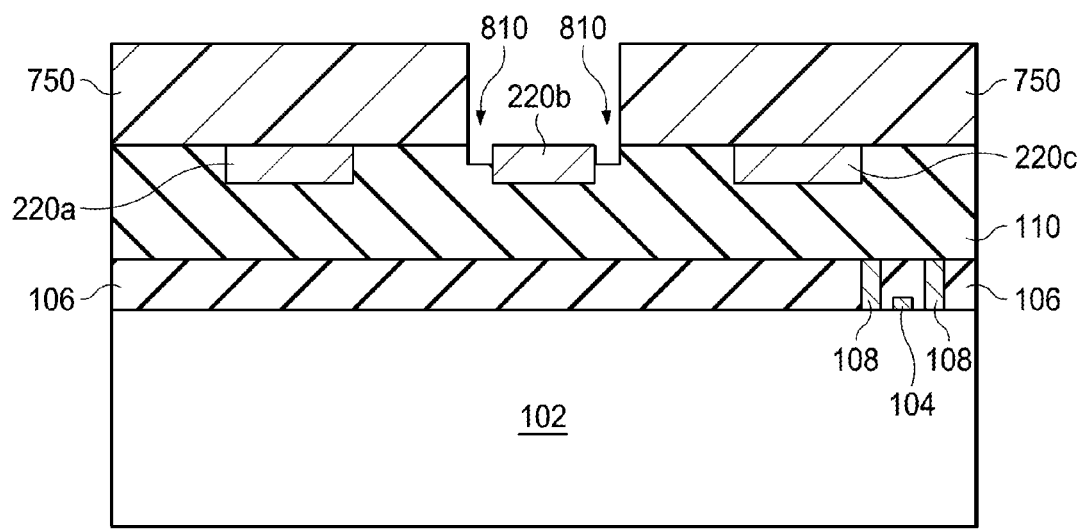
Figure 9A:
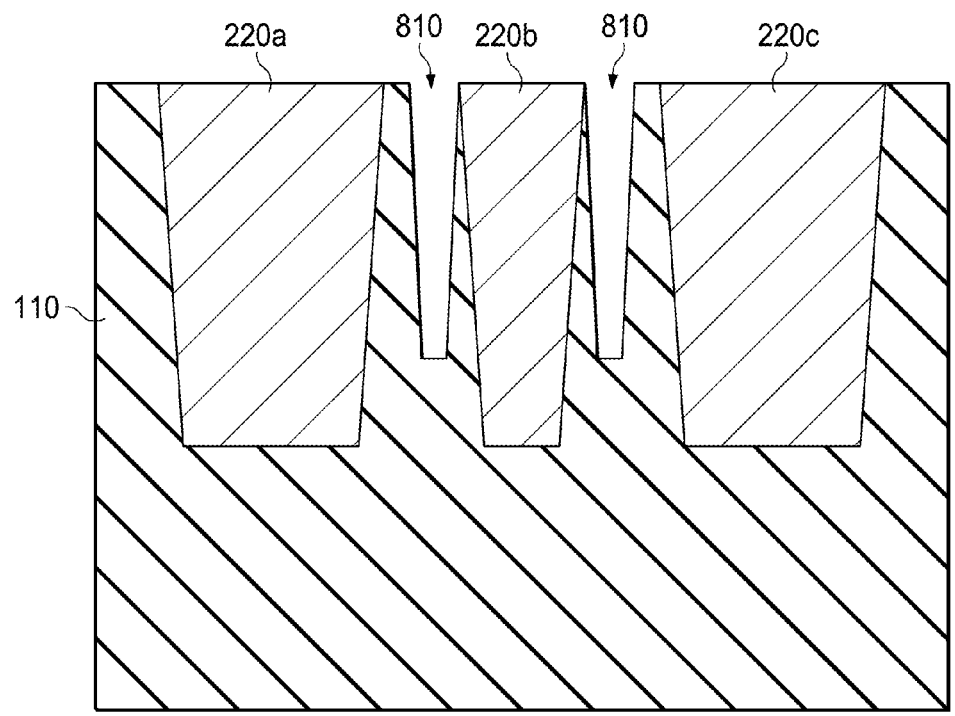
Figure 9B:
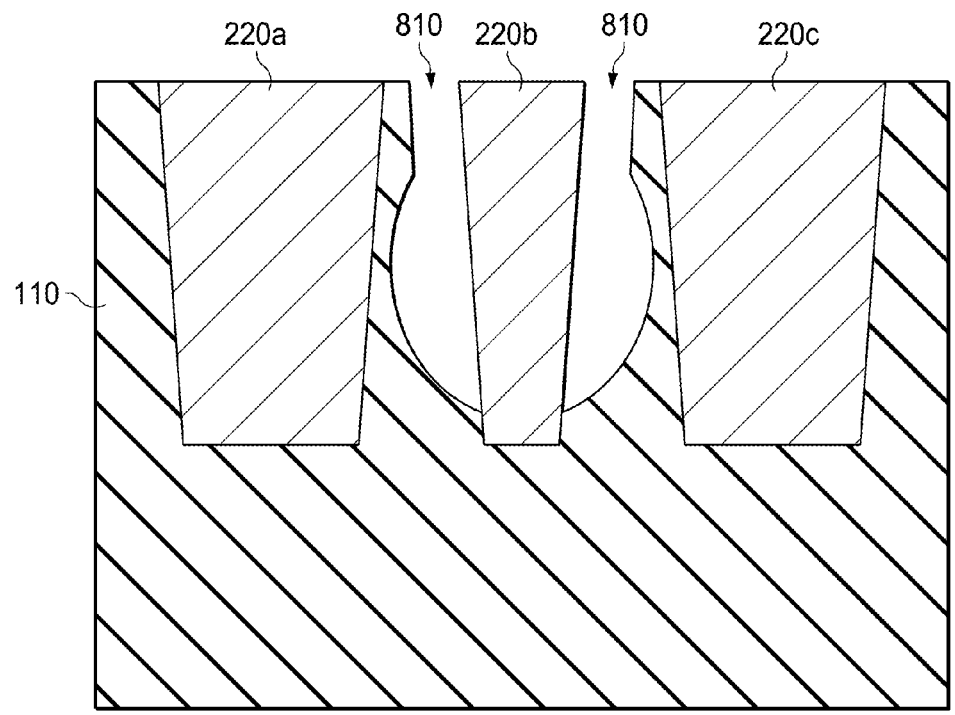
Figure 9C:
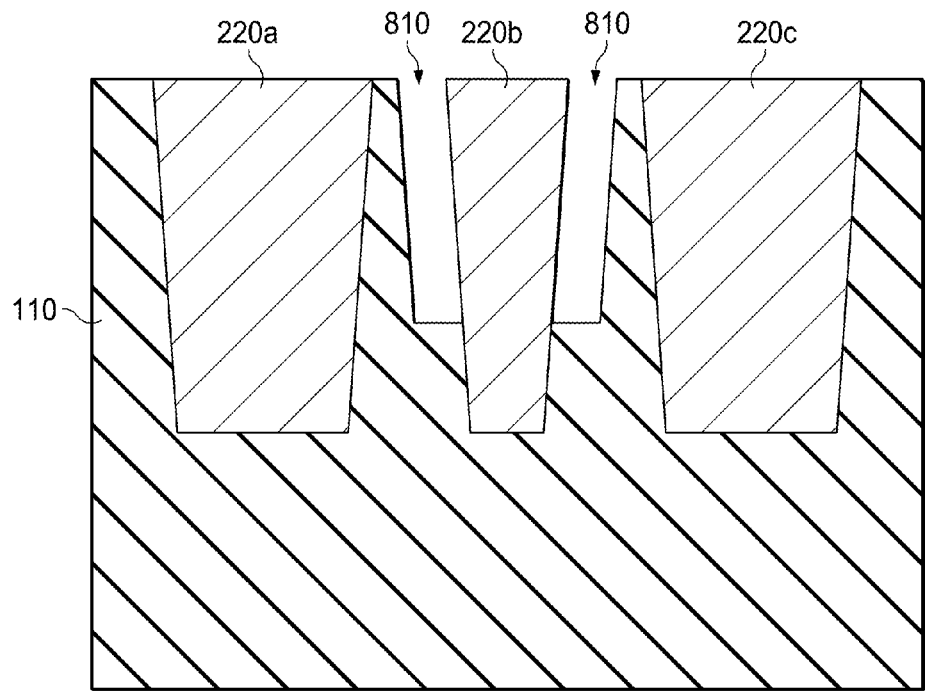

FIG. 8 illustrates openings 810 created adjacent to the narrower conductive line 220b in accordance with an embodiment. Using the mask 750 as an etch mask, the openings 810 may be formed using a variety of etch processes, selected to achieve a specific desired shape. For example, FIGS. 9A-9C illustrate various shapes that may be achieved with different etch processes. In an embodiment, the openings have a width of about 10% to about 90% of the space between 220a and 220b and a depth of about 10% to about 90% of the thickness of conductive lines.

FIG. 9A illustrates an air gap that may be achieved by a plasma etch using fluoride gases such as $CF_4$, $CH_2F_2$, $CHF_3$, $CH_3F$, $C_4F_8$, $C_4F_6$, $C_5F_8$ as main process gases to etch dielectrics, using $N_2$ or $O_2$ or $H_2$ as assistant gases, and using Ar or He or other inert gases as carrier gas. In this embodiment, an opening create by the etch process creates a tapered sidewall, creating a gap of material of the second dielectric layer 110 between opening and the conductive line.

FIG. 9B illustrates another example of an air gap, which may be achieved by a wet etch using F-containing solution to etch dielectrics, such as dilute HF or other organic F compounds to prevent attack on the metal conductive lines. In other embodiments, metal inhibitors may be added to prevent or reduce the solution attacking the conductive metal lines.

FIG. 9C illustrates yet another example of an air gap, which may be achieved by a vapor etch using HF or $NF_3$ gas as the main etching gas for dielectrics; $N_2$ or $NH_3$ or other N-contained gases as the assistant gases; and Ar or He or other inert gases as carrier gas. In an embodiment, a subsequent heating step (temperature from about 350K to about 600K) is performed to remove by-products on the dielectric films.

FIG. 8 also illustrates removal of the mask 750, which may be removed using an ashing process.

Figure 10:
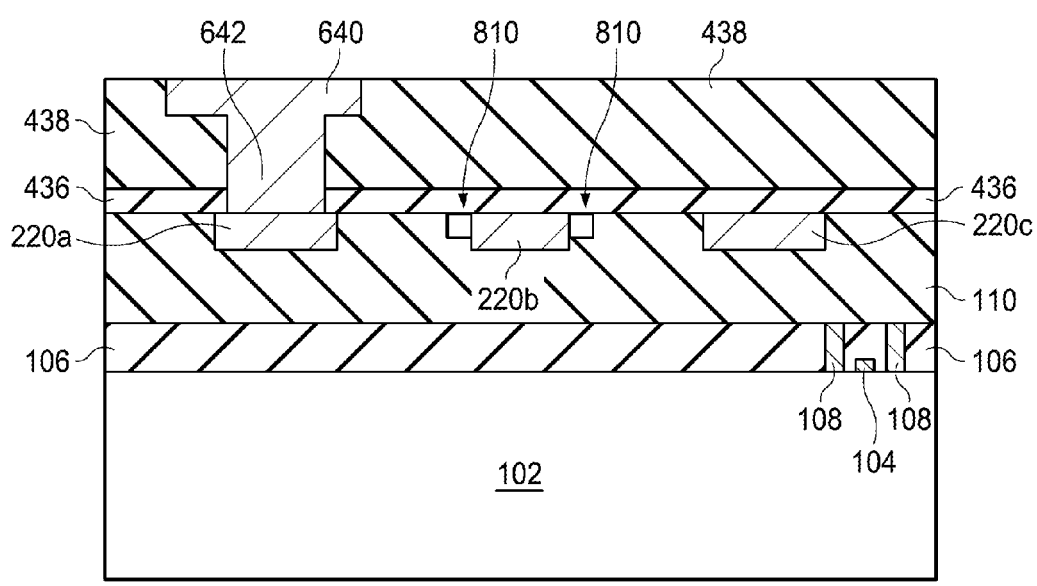

Referring now to FIG. 10, there is shown the device after processes similar to those discussed above with reference to FIGS. 4-6, wherein like reference numerals refer to like elements. In particular, FIG. 10 illustrates the ESL 436 and the third dielectric layer 438 formed over the second dielectric layer 110. Due to the small size of the openings 810 (see FIG. 8), the ESL 436, or other overlying layer, does not fill the openings 810, but rather seals the opening and creates an air gap or void adjacent to the narrower conductive line 220b.

FIG. 10 also illustrates a trench 640 and via 642 filled with a conductive material, thereby making an electrical contact to the conductive line 220a.

Figure 11A:
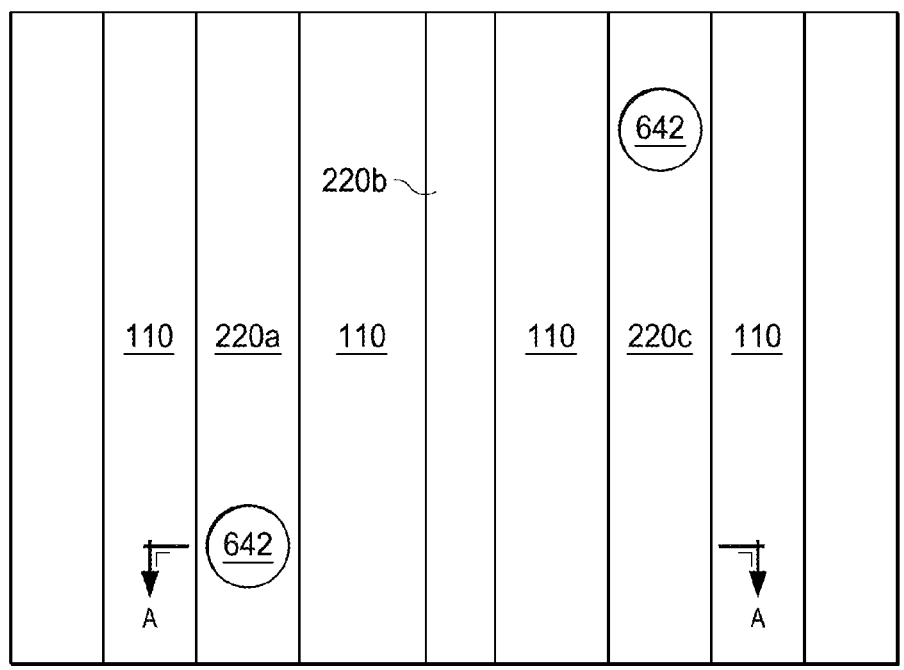
FIGS. 11A and 11B are plan views of embodiments.
Figure 11B:
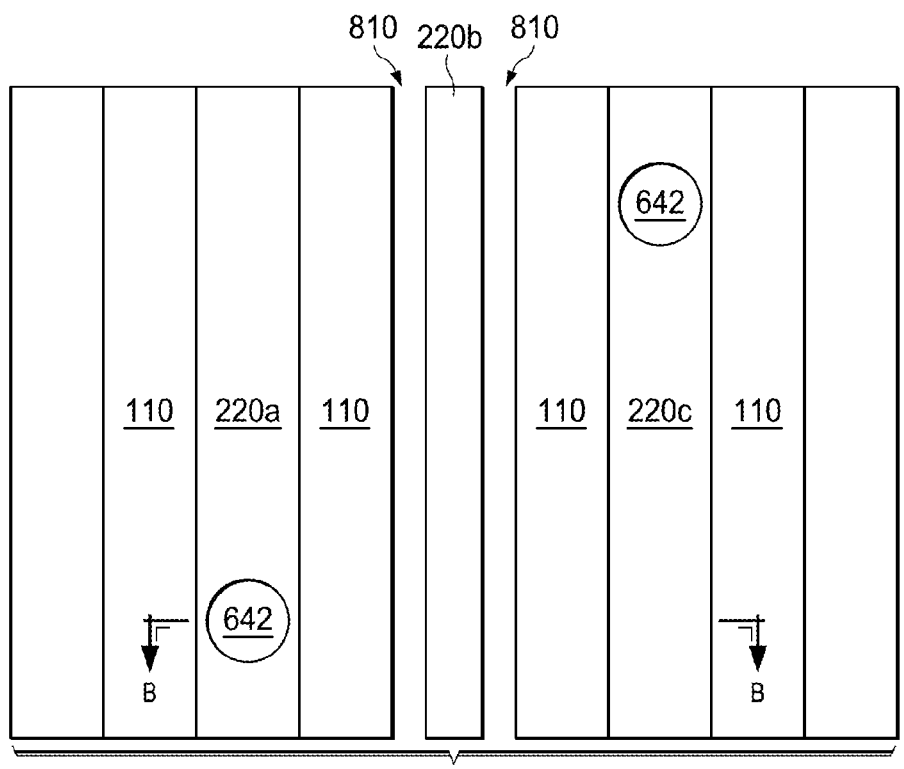
Figure 12:
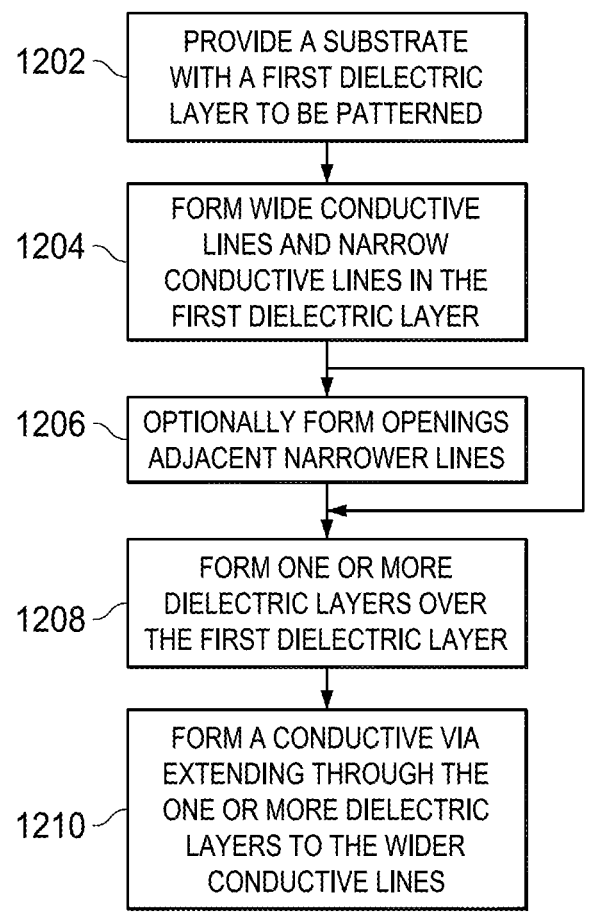
FIG. 12 is a flowchart illustrating a method of forming a semiconductor device in accordance with an embodiment.

FIGS. 11A and 11B illustrates a plan view illustrating the conductive lines 220a-c formed in the second dielectric layer 110, with a placement of the vias 642 shown. For reference FIGS. 1-6 are cross-sectional views taken along the A-A line of FIG. 11A, and FIGS. 7-10 are cross-sectional views taken along the B-B line of FIG. 11B. As shown in FIGS. 11A and 11B, the wider conductive lines 220a and 220c have contacting vias. The conductive lines not having a via contacting are narrower, such as narrower conductive line 220b FIG. 12 illustrates a flow chart illustrating a process of forming a structure in accordance with an embodiment. The process begins in step 1202, wherein a substrate having a first dielectric layer thereon is provided, such as that discussed above with reference to FIG. 1. The first dielectric layer may be an ILD layer and/or IMD layer. In step 1204, wide conductive lines and narrow conductive lines are formed, such as discussed above with reference to FIGS. 2-3. As discussed above, vias will be formed through an overlying layer. The wider conductive lines are used to provide wider lines to contact the vias, reducing electron migration and void formation.

In step 1206, openings are optionally formed adjacent to the narrower lines, such as those discussed above with reference to FIGS. 7-9. The openings create voids adjacent the narrower lines when overlying dielectric layers are formed. (See, e.g., FIG. 10.) In step 1208, one or more dielectric layers are formed over the first dielectric layer, such as those discussed above with reference to FIGS. 4 and 5. The dielectric layers are patterned to form a conductive via extending through the dielectric layers to the wider conductive lines, such as that discussed above with reference to FIGS. 5 and 6. In this embodiment, the narrower conductive lines are absent an overlying via.

In an embodiment, a method of forming an integrated circuit structure is provided. The method includes forming a plurality of conductive lines on a substrate such that a first conductive line is wider than a second conductive line. A dielectric layer is formed over the conductive lines, and a via is formed to connect to the first conductive line while no via connects directly to the second conductive line. Air gaps or voids may be formed adjacent to the narrower second conductive line.

In another embodiment, another method of forming an integrated circuit structure is provided. The method includes forming a first conductive element and a second conductive element in a first dielectric layer such that the first conductive element has a first width greater than a second width of the second conductive element. A second dielectric layer is formed over the first conductive element and the second conductive element, and a via is formed through the second dielectric layer to contact the first conductive element, while the second conductive element having the second width is entirely covered by the second dielectric layer. Air gaps or voids may be formed adjacent to the narrower second conductive line.

In yet another embodiment, a semiconductor device is provided. The semiconductor device includes a substrate having a first dielectric layer with a plurality of wide conductive lines and a narrow conductive line formed therein. A second dielectric layer overlies the first dielectric layer. Vias extend through the second dielectric layer to respective ones of the plurality of wide conductive lines, while the narrow conductive line being covered with the second dielectric layer Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:

forming a plurality of conductive lines in a first dielectric layer over a substrate, upper surfaces of the conductive lines being level with upper surfaces of the first dielectric layer, a first conductive line of the plurality of conductive lines being wider than a second conductive line of the plurality of conductive lines;

after forming the conductive lines, forming a mask over the first conductive line, the second conductive line being exposed;

after forming the mask, removing portions of the first dielectric layer to form an air gap adjacent opposing sides of the second conductive line, the air gap being an only air gap interposed between the first conductive line and the second conductive line;

forming a second dielectric layer over the plurality of conductive lines, an uppermost boundary of the air gap being below a bottommost surface of the second dielectric layer; and forming a via connecting to the first conductive line while no via connects directly to the second conductive line having the air gap adjacent thereto.

2. The method of claim 1, wherein the first conductive line has a width between 1.03 and 3 times a width of the second conductive line.

3. The method of claim 1, wherein the forming the air gap comprises a dry etch process, a wet etch process, or a vapor etch process.

4. The method of claim 1, wherein at least a portion of the air gap is spaced apart from the second conductive line.

5. The method of claim 1, wherein a width of the air gap increases below an upper boundary of the air gap.

6. The method of claim 1, wherein a thickness of the second conductive line is less than a depth of the air gap.

7. The method of claim 1, wherein a depth of the second conductive line is greater than a depth of the air gap.

8. The method of claim 1, wherein removing portion of the first dielectric layer comprises a wet etch process using a fluorine-containing etchant.

9. A method of forming an integrated circuit structure, the method comprising:

forming a first conductive element and a second conductive element in a first dielectric layer, the first conductive element having a first width greater than a second width of the second conductive element;

after forming the first conductive element and the second conductive element, forming a mask layer over the first conductive element such that the second conductive element remains exposed;

after forming the mask layer, removing portions of the first dielectric layer to form an air gap adjacent opposing sides of the second conductive element while the first conductive element is covered by the mask layer, the first conductive element being free of an adjacent air gap;

forming a second dielectric layer over the first conductive element and the second conductive element, the air gap not extending above an uppermost surface of the first conductive element and the second conductive element; and forming a via through the second dielectric layer contacting the first conductive element, the second conductive element having the second width and no adjacent air gap being entirely covered by the second dielectric layer.

10. The method of claim 9, wherein the first width is between 1.03 and 3 times the second width.

11. The method of claim 9, wherein the forming the air gap comprises a dry etch process, a wet etch process, or a vapor etch process.

12. The method of claim 9, wherein the air gap has tapered sidewalls such that a sidewall of the air gap extends away from the second conductive element.

13. The method of claim 9, wherein the air gap comprises an expanded region having a greater width than an opening of the air gap.

14. The method of claim 9, wherein the air gap exposes a sidewall of the second conductive element and an upper width of the air gap is less than a lower width of the air gap.

15. The method of claim 9, wherein the first dielectric layer is a low-k dielectric.

16. A method of forming an integrated circuit structure, the method comprising:

forming a first dielectric layer over a substrate;

forming a plurality of conductive elements in the first dielectric layer, the plurality of conductive elements comprising a first subset having a first width and a second subset having a second width, upper surfaces of the plurality of conductive elements being level with an upper surface of the first dielectric layer;

after forming the plurality of conductive elements, forming a mask layer over the first dielectric layer, the mask layer extending over the first subset of the plurality of conductive elements and the first dielectric layer adjacent to the first subset of the plurality of conductive elements;

after forming the mask layer, removing an exposed first portion of the first dielectric layer adjacent a second conductive element of the second subset, thereby forming first openings on adjacent sides of the second conductive element;

after removing the exposed first portion of the first dielectric layer, forming a second dielectric layer over the plurality of conductive elements, the second dielectric layer sealing a sealed void adjacent the second conductive element, the sealed void being completely below an upper surface of the second conductive element; and forming a plurality of vias extending through the second dielectric layer, each of the plurality of vias extending to respective ones of the first subset of the plurality of conductive elements, the second subset of the plurality of conductive elements being free of a via extending through the second dielectric layer, the first width being different than the second width.

17. The method of claim 16, wherein the first openings expose a sidewall of the second conductive element.

18. The method of claim 16, wherein the sealed void has a non-uniform width.

19. The method of claim 16, wherein the removing the exposed first portion is performed at least in part by a dry etch process.

20. The method of claim 16, wherein removing the exposed first portion comprises performing a vapor etch using a nitrogen-containing gas.

* * * * *